United States Patent
Liu et al.

(10) Patent No.: US 7,496,817 B2
(45) Date of Patent: Feb. 24, 2009

(54) METHOD FOR DETERMINING INTEGRITY OF MEMORY

(75) Inventors: Po-Wei Liu, Tai-Nan (TW); Chang-Lien Wu, Tai-Chung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 415 days.

(21) Appl. No.: 10/708,276

(22) Filed: Feb. 20, 2004

(65) Prior Publication Data
US 2005/0188286 A1 Aug. 25, 2005

(51) Int. Cl.
*G01R 31/30* (2006.01)
(52) U.S. Cl. ............ 714/733; 714/718; 365/201; 324/210; 324/73.1; 360/26; 360/47; 360/53; 377/73.1
(58) Field of Classification Search .......... 714/718, 714/719, 733, 30, 799, 742; 365/201; 324/210, 324/73.1; 360/26, 47, 53; 377/28
See application file for complete search history.

(56) References Cited

U.S. PATENT DOCUMENTS

| | | | |
|---|---|---|---|
| 5,051,997 A * | 9/1991 | Sakashita et al. ............ 714/732 |
| 6,297,995 B1 * | 10/2001 | McConnell et al. ......... 365/201 |
| 6,374,370 B1 * | 4/2002 | Bockhaus et al. ............ 714/39 |
| 6,550,023 B1 * | 4/2003 | Brauch et al. ................. 714/42 |
| 6,615,378 B1 | 9/2003 | Dwork |
| 6,718,496 B1 * | 4/2004 | Fukuhisa et al. ............ 714/733 |
| 6,781,898 B2 | 8/2004 | Kim et al. |
| 6,857,092 B1 * | 2/2005 | Fox ........................... 714/733 |
| 6,917,548 B2 | 7/2005 | Kim et al. |
| 6,952,623 B2 * | 10/2005 | McAdams et al. .......... 700/115 |
| 2003/0145250 A1 | 7/2003 | Chin |
| 2004/0028048 A1 | 2/2004 | Jin |
| 2004/0085821 A1 | 5/2004 | Kim et al. |
| 2005/0134360 A1 * | 6/2005 | Aipperspach et al. ....... 327/513 |
| 2005/0188286 A1 | 8/2005 | Liu et al. |

OTHER PUBLICATIONS

Chih-Tsun Huang, Jing-Reng Huang, Chi-Feng Wu, Cheng-Wen Wu, Tsin-Yuan Chang (National Tsing Hua University); A Programmable BIST Core for Embedded DRAM; Jan.-Mar. 1999; p. 59-p. 69.

* cited by examiner

*Primary Examiner*—Esaw T Abraham
(74) *Attorney, Agent, or Firm*—Winston Hsu

(57) ABSTRACT

A method for testing the integrity of a memory with defective sections under a plurality of operating environments includes testing the memory with defective sections under a plurality of operating environments, recording results of each operating environment test, and comparing the results of the tests. If the results of are the same, the memory with defective sections is declared to have integrity. If not, the memory with defective sections is declared to not have integrity.

30 Claims, 3 Drawing Sheets

METHOD FOR DETERMINING INTEGRITY OF MEMORY

BACKGROUND OF INVENTION

1. Field of the Invention

The invention relates to a method for determining the integrity of memory and more particularly, to a method for determining the integrity of defective memory under a plurality of operating environments.

2. Description of the Prior Art

An essential component in today's electronic devices, such as switches, routers, or the like, is memory, such as a header table or a packet buffer. Because of the important role that memory plays in electronic devices, it is standard practice to only use memory that is free from defects in electronic devices. However, it is not to say that memory must be defective free in order to be incorporated for use. Given the right techniques, manufacturers could use memory with defective sections in a product and still have the product retain the same functionality as a product that uses defective free memory.

However, before a defective memory is employed in the use of a product, a manufacturer should be certain about the memory's integrity. That is to say, a manufactured memory should have consistency throughout a certain range of operating environment condition settings. In this case, a memory with integrity is a memory in which the number of defects and their respective locations are consistent under all the operating environments an electronic device is intended to perform under. For example, imagine a product is intended to run under two operating environments in regards to a voltage condition—low and medium. After testing processes it is discovered that a defective memory that the manufacturer plans to use in the product has two defects one at section 1, the other at section 5—when under a low voltage environment. In order for the memory to be declared as having integrity, the memory would have the two defects at the same sections when under a medium voltage environment. Any other case, and the memory lacks integrity (For example, there are three defects under the medium voltage, or there are two defects but one is at section 3 and the other at section 6).

A defective memory's integrity is important to check because a defective memory lacking integrity and used in an electronic device can cause operating problems in the electronic device. For example, imagine a memory lacking integrity is used inside a switch, such as a header table memory or a packet buffer memory used in a switch; the number of defects increases when the circuits (including the memory) of the switch operate above a threshold temperature. When the switch is first turned on, the circuits are below the threshold temperature. However, after operating for a certain amount of time, the circuits of the switch reach the threshold temperature. The switch then tries to access a section of the memory that was accessible when under the threshold temperature but now has become defective because the threshold temperature has been reached, resulting in malfunction, e.g. difficulty in forming and utilizing a linked list associated with the header table or the packet buffer.

SUMMARY OF INVENTION

It is therefore one of the many objectives of the claimed invention to provide a method for testing the integrity of a memory with defective sections under a plurality of operating environments.

According to the claimed invention, a method for testing the integrity of a memory with defective sections under a plurality of operating environments is disclosed. The claimed method for determining the integrity of a memory under a plurality of operating environments comprises: setting a current operating environment out of the plurality of operating environments for a condition to be tested; testing the memory under the current operating environment; recording a result of the testing step for the current operating environment; and comparing the recorded result for the current operating environment with a recorded result for a previous operating environment.

The claimed invention provides a method of testing the integrity of memory with defective sections. As one of the many advantages in using the claimed invention, manufacturers can confidently employ the use of memory with defective sections in their products and still have the product perform reliably. As a result, manufacturers can improve the amount of memory deemed usable after each fabrication, thus leading to lowered costs and increased efficiency.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
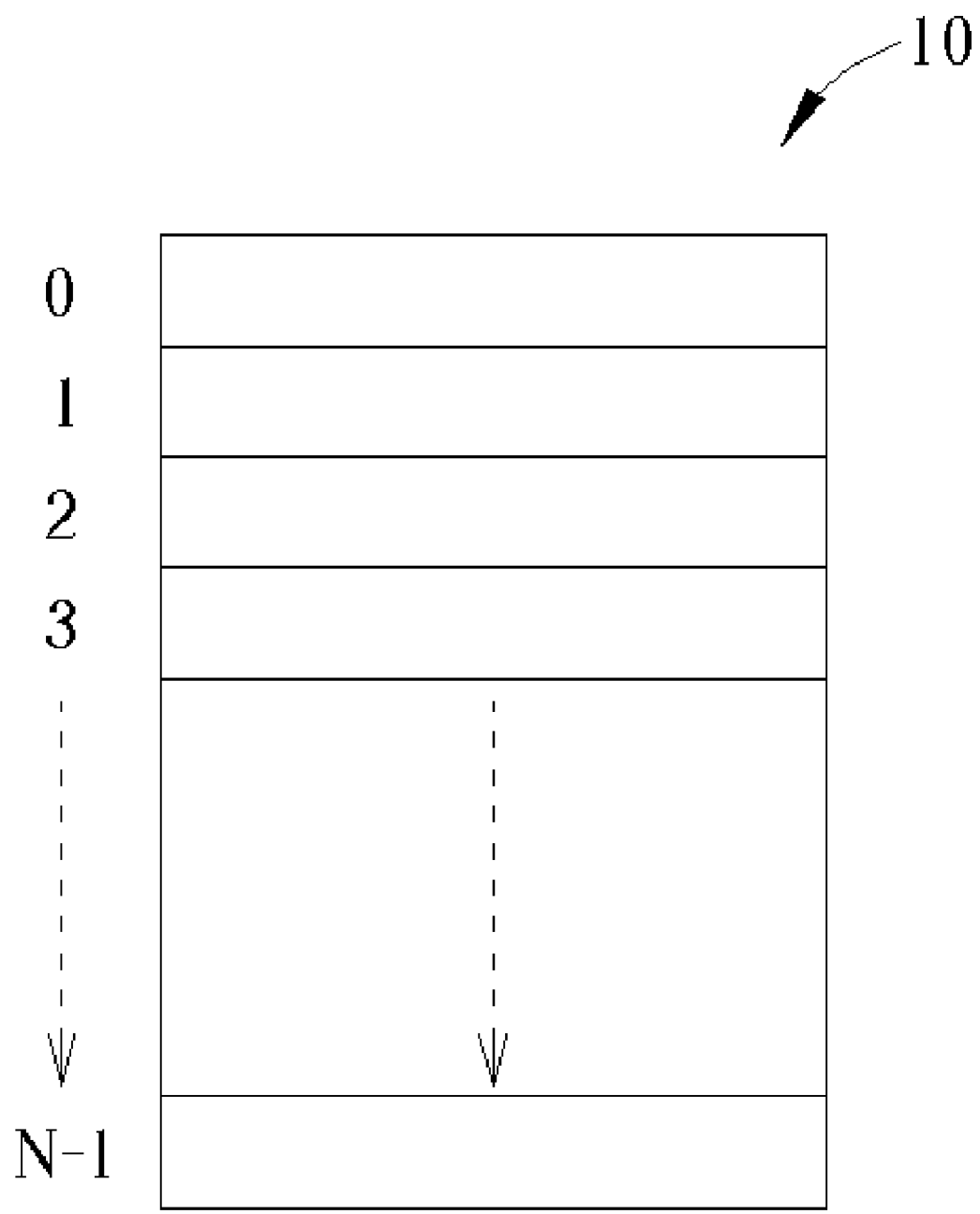
FIG. 1 is a block diagram of a memory to be tested according to an embodiment of the present invention.

Please refer to FIG. 1. FIG. 1 is a block diagram of a memory to be tested according to an embodiment of the present invention. The memory 10 in FIG. 1 is to be taken as an example for the memory referred to in FIG. 2 and FIG. 3. For actual applications, the memory 10 can be a header table, a packet buffer in a switch, or the like. The memory 10 is divided into N sections. As stated earlier, the present invention provides a method for testing the integrity of a memory with defective sections under a plurality of operating environments for a given condition. The condition and number of operating environments to be tested are left for the tester to decide. For example, the tester may choose to test two conditions—voltage and temperature. Under each condition, the tester may choose 3 operating environments—low, medium, and high. The tester can choose to be even more specific when listing operating environments by listing values such as 1.8 volts, 3.3 volts, and 5 volts for voltage or 65 degrees, 100 degrees, and 130 degrees for temperature. These should only be taken as examples and not a limitation of the present invention.

Figure 2:
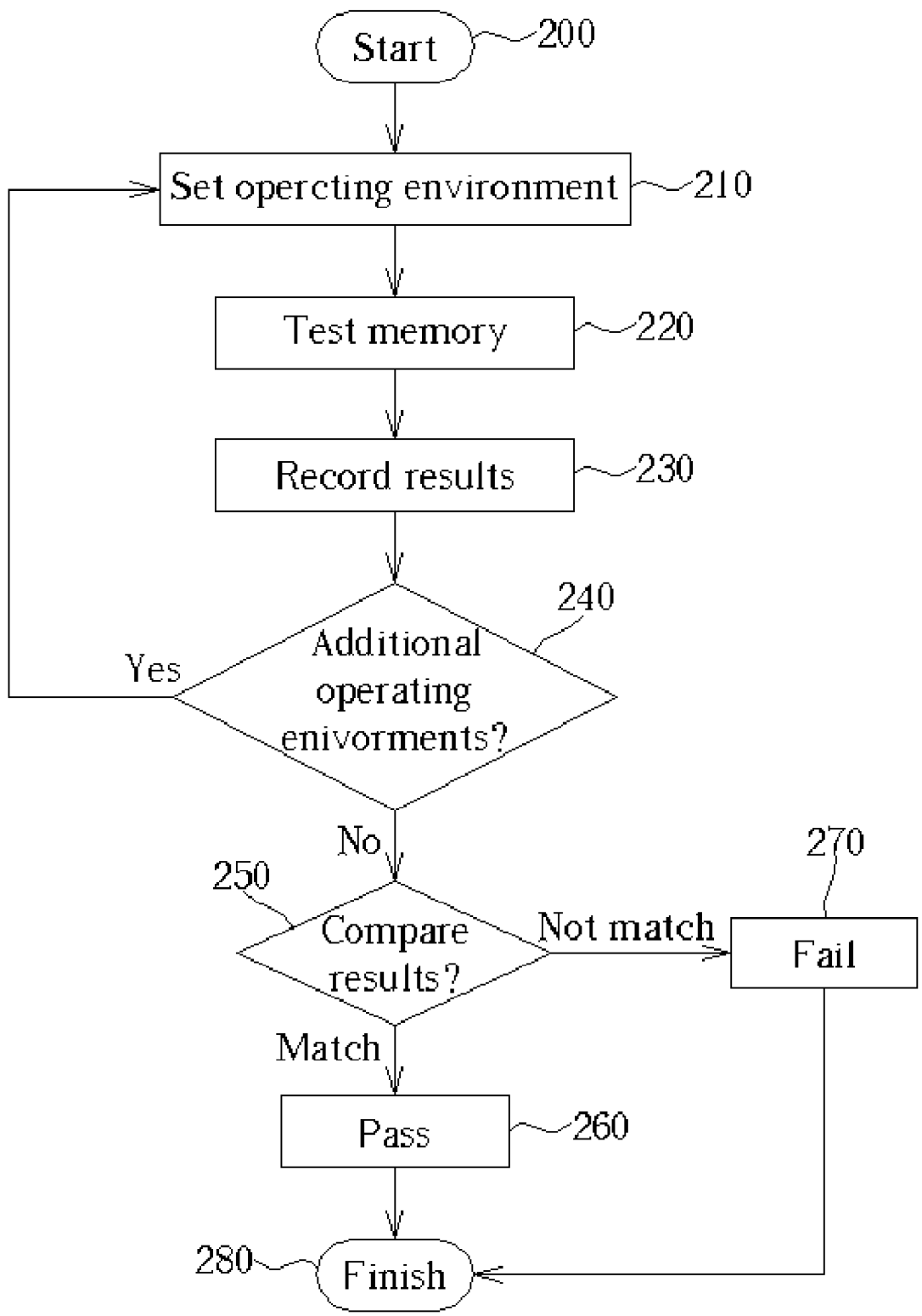
FIG. 2 is a diagram of a flowchart of a method employed according to an embodiment of the present invention.

Please refer to FIG. 2. FIG. 2 is a diagram of a flowchart of a method employed according to an embodiment of the present invention. It is assumed prior to the steps listed that the tester has already chosen the condition and the corresponding number of operating environments. In this embodiment of the present invention the steps are as follows. For details concerning the built-in self test (BIST), please refer to "a programmable BIST core for embedded DRAM", by Huang et. al., IEEE Design and Test Magazine, January-March 1999, which is incorporated herein by reference.

Step 200: Start.

Step 210: Set Operating Environment. The testing system sets up the current operating environment that the memory 10 is to be tested under as one of a plurality of operating environments. Each time this step is executed, a different operating environment is set up.

Step 220: Test Memory. The memory 10 is tested to detect the number of defects present in the memory 10 and their respective locations. This testing step can be embodied, as one example, by applying a built-in self test (BIST) on the memory 10.

Step 230: Record Results. The results of the test are recorded so that they can be compared with results from other tests in other operating environments. These test results recorded in this step are known as current test results.

Step 240: Additional Operating Environments? The testing system checks if there are other additional operating environments to be checked. If there are, then that means the test is not over, and the testing system returns to Step 210. Otherwise it means that the test is over, and go to step 250.

Step 250: Compare results. The testing system compares the results of all tests. If results match, go to step 260. Otherwise, go to step 270.

Step 260: Pass. The memory 10 has passed all the operating environment tests and therefore, declared as having integrity. The memory 10 is suitable for use in an electronic device.

Step 270: Fail. The number and/or location of defective sections in the memory 10 is not consistent and therefore, declared as not having integrity. The memory 10 is not suitable for use in an electronic device.

Step 280: Finish.

To illustrate, assume that a memory 10 divided into N sections is being tested under the condition of voltage with the operating environments of low, medium, and high to be tested in that order. The testing system begins by setting the operating environment for low voltage (step 210). Then, the memory 10 is tested (step 220) and the results recorded (step 230) assume that the testing system finds one defect present at section 1. Next, the testing system checks if there are any additional operating environments to be tested left untested (step 240). Since this is the first time through and there still exist two additional operating environments of medium voltage and high voltage, the testing system returns to set the operating environment.

This time the testing system will set the operating environment for medium voltage (step 210). The memory 10 is tested (step 220) and the results recorded (step 230). Now assume that the medium voltage test yields one defect at section 1. Again in step 240 since still one additional operating environment is found left untested, steps 210, 220, and 230 are performed once again for the operating environment of high voltage, and a corresponding result is stored.

After having these tested result stored, the testing system will find there is not more operating environments left to be tested (step 240). As a result the testing system proceeds to compare if the testing results stored for various operating environments, which in this embodiment are low voltage, medium voltage, high voltage, match with one another (step 250). If the above testing result for high voltage also reads one defect at section 1 and the results for these operating environments match, the memory 10 is then deemed to have passed the process and as having integrity (step 260). The memory 10 therefore can be used in an electronic device. However for example, if the above testing result for high voltage yields an additional defect at section 8 and the results for these operating environments do not match, the memory 10 is deemed as not having integrity and therefore, not usable in an electronic device (step 270).

Please note, that the method diagramed in FIG. 2 should not be taken as limitations; the illustrated serves merely as an example. Also note that the condition of voltage and temperature along with the operating environments of low, middle, and high are also merely examples, which means testing methods incorporating other conditions concerning operating environment testing, or a combination thereof, that one skilled in the art will appreciate, also fall into scope of the claimed invention.

Figure 3:
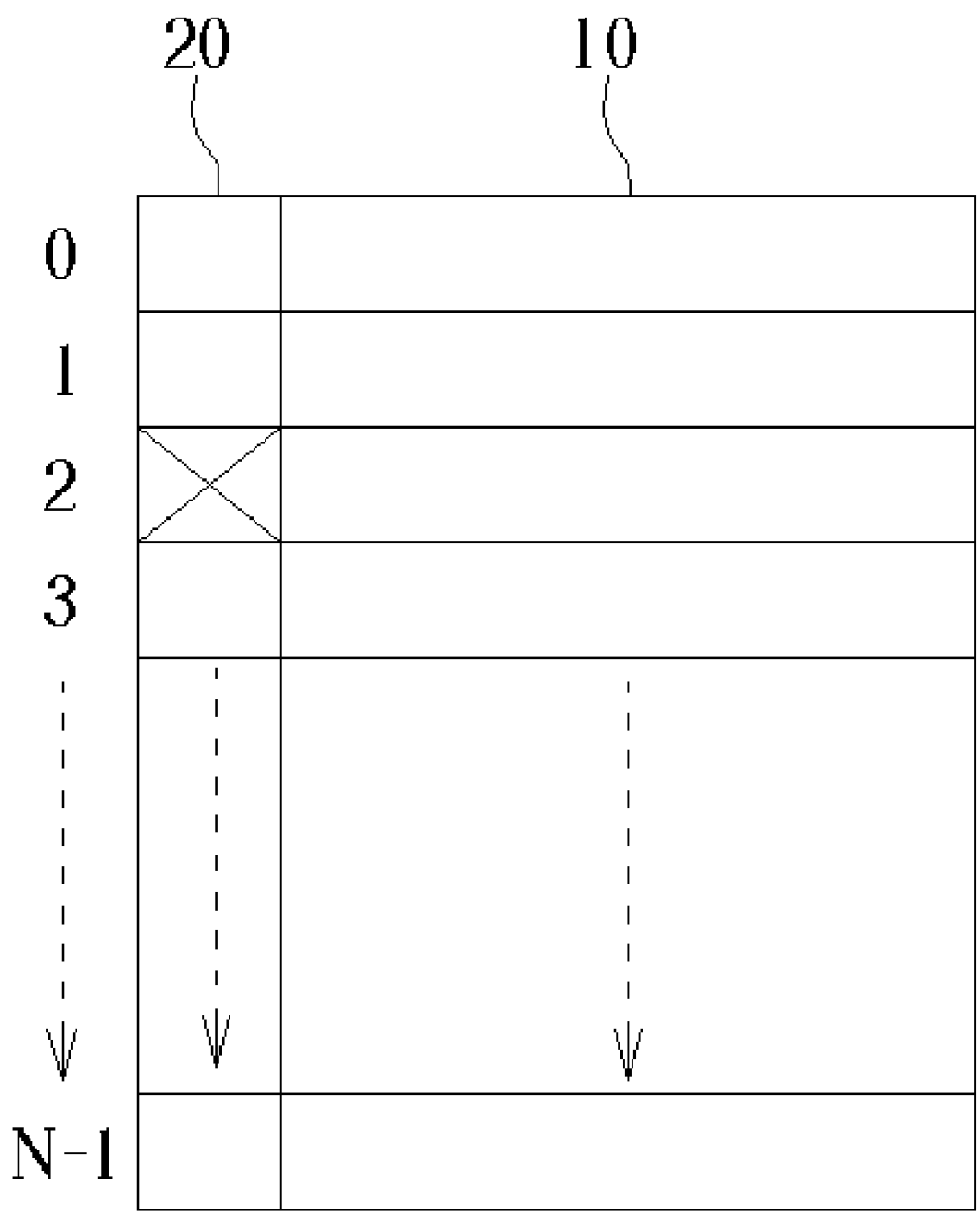
FIG. 3 is a block diagram of a status record memory and the memory of FIG. 1 according to an embodiment of the present invention.

For step 220 described above, according to an embodiment of the present invention, the BIST can be performed on the memory 10 associated with a status record memory 20, as shown in FIG. 3. As shown in FIG. 3 each section of the status record memory 20 corresponds to one section of the memory 10 and serves to record the defective status of that corresponding section of the memory 10. In this embodiment after the BIST is performed, the sections of the status record memory 20 corresponding to detected defective sections of the memory 10 will be marked, as shown in FIG. 3 a crossed out section to indicate a defective status. Then the recording step 230 can be implemented by recording the content of the status record memory 20.

In this embodiment, the testing data of the BIST are inputted by the testing system to the electronic device (for example, an integrated circuit chip) having the memory to be tested via a plurality of I/O interfaces (for example, pins of the IC chip) of the electronic device. The comparing step of step 250 may be performed, without limitation, by an embedded comparing circuitry fabricated in the electronic device. The comparing result may be latched in a built-in register of the electronic device for later pass/fail indication use.

The present invention provides a method of testing the integrity of memory with defective sections. By employing this method, manufacturers can confidently employ the use of memory with defective sections in their products and still have the product perform reliably. As a result, manufacturers can improve the amount of memory deemed usable after each fabrication, thus leading to lowered costs and increased efficiency.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A method for determining whether a memory is defected or has integrity under a plurality of operating environments comprising:

setting a plurality of operating environments respectively corresponding to variations in a condition to be tested;

repeatedly testing the same memory having defective sections under each of the plurality of operating environments;

recording a result of the testing step for each of the plurality of operating environments; and comparing the recorded results for each of the plurality of operating environments, wherein if the results are the same for each of the plurality of operating environments then the memory is determined to have integrity and if the results are different for at least two of the plurality of operating environments then the memory is determined to be defected.

2. The method of claim 1, wherein the testing step further comprises:
performing a built-in self test (BIST) on the memory under each of the plurality of operating environments.

3. The method of claim 2 further comprising:
marking a status record memory according to the BIST, wherein the status record memory corresponds to the memory; and
recording the content of the status record memory for each of the plurality of operating environments.

4. The method in claim 1 wherein the condition to be tested is a variance in supply voltage.

5. The method in claim 1 wherein the condition to be tested is a variance in temperature.

6. The method of claim 1 wherein the testing step further comprises:
detecting information concerning defects in the memory; and
counting the number of defects in the memory under each of the plurality of operating environments.

7. The method in claim 6 wherein the recording step further comprises:
storing the number of defects detected in the memory.

8. The method in claim 7 wherein the comparing step further comprises:
accessing the stored number of defects to determine if the numbers of defects detected in the memory under each of the plurality of operating environments are equal to one another;
wherein if the numbers of defects detected in the memory under each of the plurality of operating environments are equal to one another then the memory is determined to have integrity.

9. The method in claim 6 wherein the recording step further comprises:
recording and storing the position of each defect detected in the memory under each of the plurality of operating environments.

10. The method in claim 9 wherein the comparing step further comprises:
determining if the positions of defects of the memory under each of the plurality of operating are the same as one another.

11. A method for determining whether a memory is defected or has integrity, comprising:
testing the memory having defective sections under a first operating environment corresponding to a condition to be tested;
recording a first result of the testing step under the first operating environment;
testing the memory having defective sections under a second operating environment, wherein the second operating environment corresponds to a variation of the condition to be tested in the first operating environment;
recording a second result of the testing step under the second operating environment; and
comparing the first result with the second result, wherein if the first result is equal to the second result then the memory is determined to have integrity and if the first result is different from the second result then the memory is determined to be defected.

12. The method of claim 11 wherein the testing steps further comprise:
performing a built-in self test (BIST) on the memory.

13. The method of claim 12 further comprising:
marking a status record memory according to the BIST, wherein the status record memory corresponds to the memory; and
recording the content of the status record memory for the current operating environment.

14. The method in claim 11 wherein the condition to be tested in the first and the second operating environment is supply voltage.

15. The method in claim 11 wherein the condition to be tested in the first and the second operating environment is temperature.

16. The method in claim 11 further comprising:
determining whether the first and second results are consistent or inconsistent with one another.

17. The method in claim 11 wherein the first result comprises information of defect locations in the memory corresponding to the first operating environment and the second result comprises information of defect locations in the memory corresponding to the second operating environment.

18. A method for determining integrity of a memory with sections that are defective, the method comprising:
repeatedly testing the memory having defective sections under a plurality of operating environments respectively corresponding to a given condition to be tested;
recording a result of the testing step for each of the plurality of operating environments;
comparing the results; and
determining whether the results are consistent or inconsistent with one another;
wherein the results correspond to the given condition, and if the results are consistent with one another the memory is determined to have integrity and if the results are inconsistent with one another then the memory is determined to be defected.

19. The method in claim 18 wherein the first result comprises information regarding the number of defective sections in the memory corresponding to the first operating environment and the second result comprises information regarding the number of defective sections in the memory corresponding to the second operating environment.

20. The method in claim 18 wherein the first result comprises information regarding locations of defective sections in the memory corresponding to the first operating environment and the second result comprises information regarding locations of defective sections in the memory corresponding to the second operating environment.

21. A method for determining whether a memory is defected or has integrity under a plurality of operating environments comprising:
setting a plurality of operating environments respectively corresponding to variations in a condition to be tested;
repeatedly testing the same memory under each of the plurality of operating environments;
recording a result of the testing step for each of the plurality of operating environments; and
comparing the recorded results for each of the plurality of operating environments, wherein if the results are the same for each of the plurality of operating environments then the memory is determined to have integrity and if the results are different for at least two of the plurality of operating environments then the memory is determined to be defected.

22. The method of claim 21, wherein the testing step further comprises:
performing a built-in self test (BIST) on the memory under each of the plurality of operating environments.

23. The method of claim 22 further comprising:

marking a status record memory according to the BIST, wherein the status record memory corresponds to the memory; and recording the content of the status record memory for each of the plurality of operating environments.

24. The method in claim 21 wherein the condition to be tested is a variance in supply voltage.

25. The method in claim 21 wherein the condition to be tested is a variance in temperature.

26. The method of claim 21 wherein the testing step further comprises:

detecting information concerning defects in the memory; and counting the number of defects in the memory under each of the plurality of operating environments.

27. The method in claim 26 wherein the recording step further comprises:

storing the number of defects detected in the memory.

28. The method in claim 27 wherein the comparing step further comprises:

accessing the stored number of defects to determine if the numbers of defects detected in the memory under each of the plurality of operating environments are equal to one another;

wherein if the numbers of defects detected in the memory under each of the plurality of operating environments are equal to one another then the memory is determined to have integrity.

29. The method in claim 26 wherein the recording step further comprises:

recording and storing the position of each defect detected in the memory under each of the plurality of operating environments.

30. The method in claim 29 wherein the comparing step further comprises:

determining if the positions of defects of the memory under each of the plurality of operating are the same as one another.

* * * * *